(12) United States Patent
Daikoku

(10) Patent No.: US 10,950,763 B2
(45) Date of Patent: Mar. 16, 2021

(54) METHOD OF MANUFACTURING LIGHT EMITTING MODULE

(71) Applicant: NICHIA CORPORATION, Anan (JP)

(72) Inventor: Shinichi Daikoku, Tokushima (JP)

(73) Assignee: NICHIA CORPORATION, Anan (JP)

( * ) Notice: Subject to any disclaimer, the term of this patent is extended or adjusted under 35 U.S.C. 154(b) by 65 days.

(21) Appl. No.: 16/505,031

(22) Filed: Jul. 8, 2019

(65) Prior Publication Data

US 2020/0013933 A1 Jan. 9, 2020

(30) Foreign Application Priority Data

Jul. 9, 2018 (JP) .............................. JP2018-129824

(51) Int. Cl.
| | |
|---|---|
| *H01L 33/50* | (2010.01) |
| *F21V 8/00* | (2006.01) |
| *H01L 33/60* | (2010.01) |
| *G02F 1/13357* | (2006.01) |
| *G02F 1/1335* | (2006.01) |

(52) U.S. Cl.
CPC .......... *H01L 33/505* (2013.01); *G02B 6/0011* (2013.01); *G02F 1/133524* (2013.01); *G02F 1/133602* (2013.01); *H01L 33/60* (2013.01)

(58) Field of Classification Search
CPC ................ G02B 6/0011; G02B 6/0021; G02F 1/133602; G02F 1/133524; G02F 1/133603; G02F 1/133606; G02F 2001/133607; H01L 2933/0033; H01L 33/62; H01L 25/0753; H01L 33/54
See application file for complete search history.

(56) References Cited

U.S. PATENT DOCUMENTS

| | | | | |
|---|---|---|---|---|
| 2007/0121340 | A1* | 5/2007 | Hoshi | ............... G02B 6/0021 |
| | | | | 362/600 |
| 2010/0265694 | A1 | 10/2010 | Kim et al. | |
| 2012/0162966 | A1* | 6/2012 | Kim | ................. G02B 6/0073 |
| | | | | 362/97.1 |

(Continued)

FOREIGN PATENT DOCUMENTS

| | | | |
|---|---|---|---|
| JP | 2015032373 A | 2/2015 | |
| JP | 2018133304 A | 8/2018 | |

(Continued)

*Primary Examiner* — Karen Kusumakar
*Assistant Examiner* — Adam S Bowen
(74) *Attorney, Agent, or Firm* — Hunton Andrews Kurth LLP

(57) ABSTRACT

A method, comprising: providing a light emitting element including a semiconductor stack body and an electrode; providing a lightguide plate having a first surface and a second surface opposite to the first surface, wherein the second surface includes a plurality of recesses; arranging a light-transmitting member in each of the recesses; adjusting upper surfaces of the light-transmitting members to a uniform height; placing a wavelength conversion member on the light-transmitting member; placing the light emitting element on the wavelength conversion member with the electrode facing up; arranging a cover member that covers the light emitting element; removing the cover member until the electrode is exposed; and forming a wiring that electrically connects the light emitting elements together.

12 Claims, 9 Drawing Sheets

(56) References Cited

U.S. PATENT DOCUMENTS

| | | | |
|---|---|---|---|
| 2013/0240934 A1* | 9/2013 | Park .................. | H01L 33/46 |
| | | | 257/98 |
| 2015/0036317 A1 | 2/2015 | Yamamoto et al. | |
| 2015/0207042 A1* | 7/2015 | Yoneda ............. | H01L 24/92 |
| | | | 257/98 |
| 2015/0287892 A1 | 10/2015 | Han et al. | |
| 2016/0252218 A1* | 9/2016 | Fujikawa ........... | G02F 1/1336 |
| | | | 362/241 |
| 2017/0054062 A1* | 2/2017 | Tamaki ............. | H01L 33/507 |
| 2017/0092825 A1* | 3/2017 | Bando .............. | H01L 33/507 |
| 2017/0102127 A1* | 4/2017 | Woodgate ......... | F21K 9/68 |
| 2017/0186925 A1* | 6/2017 | Nakabayashi ..... | H01L 33/46 |
| 2018/0239193 A1 | 8/2018 | Hayashi | |
| 2018/0335559 A1* | 11/2018 | Cho ................... | G02B 6/0016 |

FOREIGN PATENT DOCUMENTS

| | | |
|---|---|---|
| KR | 20090117419 A | 11/2009 |
| WO | 2005119314 A2 | 12/2005 |

\* cited by examiner

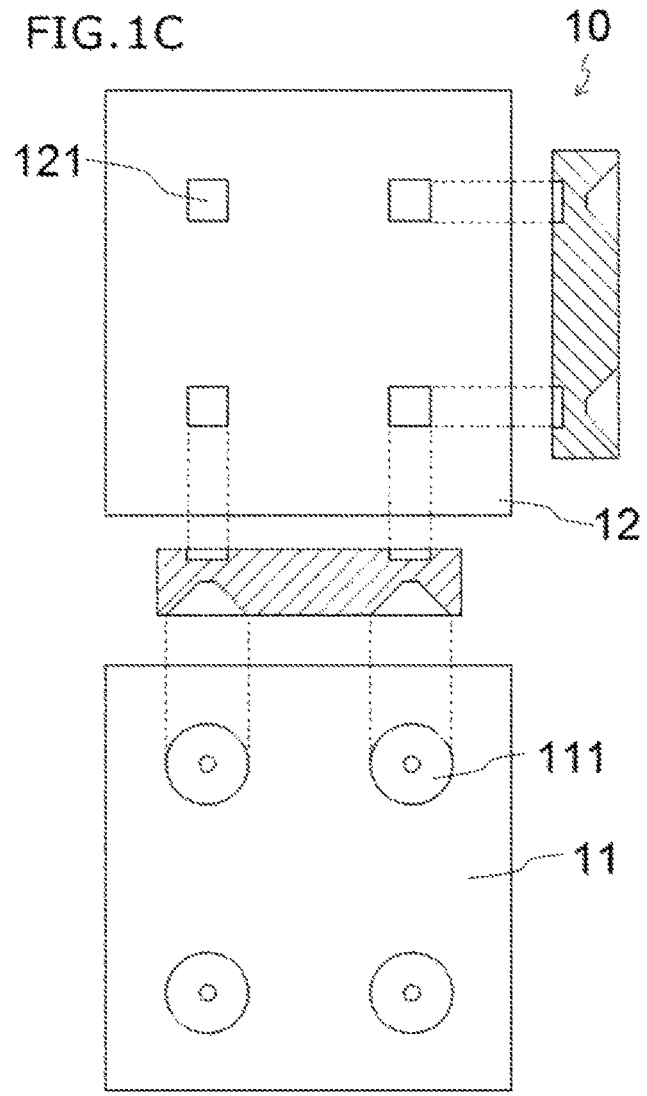

METHOD OF MANUFACTURING LIGHT EMITTING MODULE

CROSS REFERENCE TO RELATED APPLICATION

This application claims priority to Japanese Patent Application No. 2018-129824, filed on Jul. 9, 2018, the disclosure of which is hereby incorporated by reference in its entirety.

BACKGROUND

The present disclosure relates to a method of manufacturing a light emitting module.

Light emitting devices using light emitting elements such as light emitting diodes are widely used as backlights of liquid crystal displays and light sources of various displays, etc. For example, the light source device disclosed in Japanese Patent Publication No. 2015-32373 includes a plurality of light emitting elements mounted on a substrate, semispherical lens members respectively covering the light emitting elements, and a diffusion member arranged thereabove upon which light from the light emitting elements is incident.

SUMMARY

With such a light source device as that of Japanese Patent Publication No. 2015-32373, for example, the distance between the mounting board and the diffusion plate needs to be larger than the thickness of the lens members, and a sufficient thickness reduction may not be achieved.

A method of manufacturing a light emitting module of the present disclosure has the following configuration.

A method includes the steps of: providing a light emitting element including a semiconductor stack body and an electrode; providing a lightguide plate having a first surface to be a light emitting surface and a second surface opposite to the first surface, wherein the second surface includes a plurality of recesses; arranging a light-transmitting member in each of the recesses, the light-transmitting member having an upper surface at a higher position than an upper end of the recess; adjusting upper surfaces of the light-transmitting members to a uniform height; placing a wavelength conversion member on the light-transmitting member for absorbing light from the light emitting element and converting the light into light of a different wavelength; placing the light emitting element on the wavelength conversion member with the electrode facing up; arranging a cover member that covers the light emitting element including the electrode; removing the cover member until the electrode is exposed; and forming a wiring that electrically connects the light emitting elements together.

According to a certain embodiment of the present disclosure, it is possible to provide a light emitting module that includes a lightguide plate and light emitting elements and that can be made thinner.

BRIEF DESCRIPTION OF THE DRAWINGS

FIG. 1C shows an example of an optical functional section and a recess of a lightguide plate according to an embodiment of the present disclosure.

DETAILED DESCRIPTION

The present disclosure will now be described in detail with reference to the drawings. Note that while terms indicating specific directions and positions (e.g., "upper", "lower", and other terms including such terms) are used as necessary in the description below, these terms are used for ease of understanding of the disclosure with reference to the drawings, and the technical scope of the present invention is not limited by the meaning of these terms. Each part with the same reference sign appearing in different figures represents the same or equivalent part or member. Each member is denoted by the same name even if the state or shape thereof changes before and after it is cured or before and after it is cut, for example.

Moreover, the embodiment to be shown below is for illustrating a light emitting module that embodies the technical concept of the present invention, and it is not intended to limit the present invention to the description below. The size, material, shape, relative arrangement, etc., of the components described below are intended to be illustrative but not to limit the scope of the present invention thereto, unless otherwise specified. Descriptions used in an embodiment or example are applicable to other embodiments or other examples. The size, positional relationship, etc., of the members shown in each figure may be exaggerated in order to facilitate the understanding.

Embodiment 1

Figure 1A:
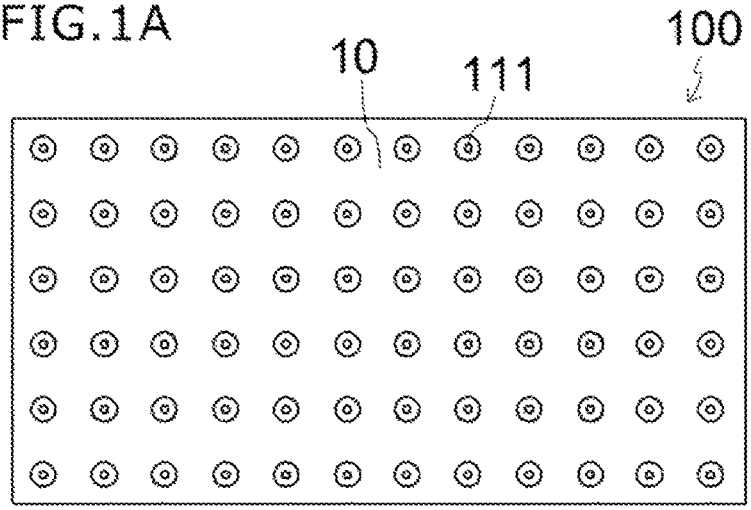
FIG. 1A is a schematic plan view of a light emitting module according to an embodiment of the present disclosure.
Figure 1B:
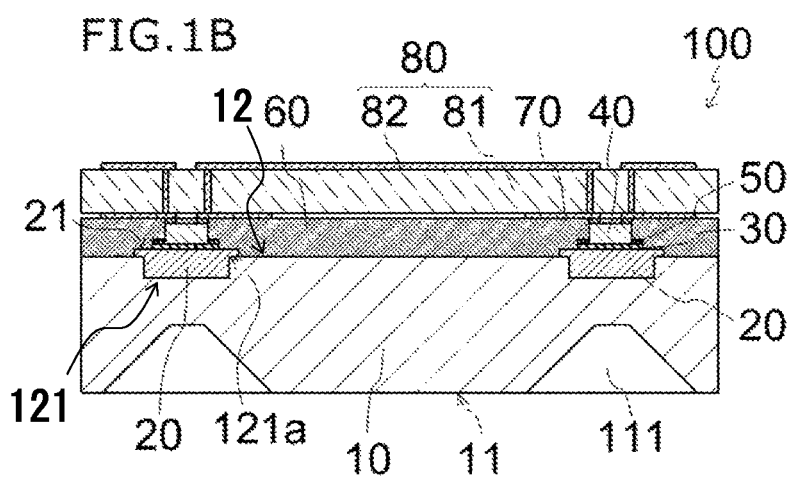
FIG. 1B is a partial enlarged schematic cross-sectional view of the light emitting module according to an embodiment of the present disclosure.

An illustrative configuration of a light emitting module of the present embodiment is shown in FIG. 1A and FIG. 1B. FIG. 1A is a schematic plan view of a light emitting module 100 of the present embodiment. FIG. 1B is a partial enlarged schematic cross-sectional view showing the light emitting module 100 of the present embodiment. The light emitting module 100 includes the lightguide plate 10, and a plurality of light emitting elements 40 attached to the lightguide plate 10.

FIG. 1C schematically shows in one drawing a partial enlarged schematic plan view and a partial enlarged schematic lateral side view of a lightguide plate 10 according to an embodiment of the present disclosure. The lightguide plate 10 of the light emitting module 100 includes the first surface 11 to be the light-extracting surface, and the second surface 12 opposite to the first surface 11. As shown in FIG. 1C, the lightguide plate 10 includes a plurality of optical functional sections 111 on the first surface 11, and a plurality of recesses 121 on the second surface 12.

In the example shown in FIG. 1B, the lightguide plate 10 includes light-transmitting members 20 inside the recesses 121. The light emitting elements 40 are arranged in a matrix pattern on the second surface 12 side of the lightguide plate 10. An upper surface (the surface on which the light emitting element 40, which is the light source, is arranged) 21 of the light-transmitting member 20 is located at a higher position than (above) an upper end (open end) 121a of the recess 121. As shown in FIG. 1B, the light emitting element 40 may be attached on a wavelength conversion member 30 provided on the light-transmitting member 20 by a bonding member 50. Thus, it can be said that, in this example, the upper surface (wavelength conversion member arrangement surface) 21 of the light-transmitting member 20 is located above the second surface 12 of the lightguide plate 10.

Such a light emitting module can be obtained by a manufacturing method including the following steps.

A method of manufacturing a light emitting module, comprising:

(1) providing a light emitting element including a semiconductor stack body and an electrode;

(2) providing a lightguide plate having a first surface to be a light emitting surface and a second surface opposite to the first surface, wherein the second surface includes a plurality of recesses;

(3) arranging a light-transmitting member in each of the recesses, the light-transmitting member having an upper surface at a higher position than an upper end of the recess;

(4) adjusting upper surfaces of the light-transmitting members to a uniform height;

(5) placing a wavelength conversion member on the light-transmitting member for absorbing light from the light emitting element and converting the light into light of a different wavelength;

(6) placing the light emitting element on the wavelength conversion member with the electrode facing up;

(7) arranging a cover member that covers the light emitting element including the electrode;

(8) removing a part of the cover member until the electrode is exposed; and (9) forming a wiring that electrically connects the light emitting elements together.

A light emitting module obtained by the method of the present disclosure can be made thinner as the light emitting elements are attached on the lightguide plate.

Since the light emitting elements are attached to the lightguide plate, positional shifting between the light emitting elements and the lightguide plate is unlikely to occur as compared with a case where a substrate, such as a wiring board, with a light emitting elements mounted thereon and a lightguide plate are combined together. Thus, it is possible to realize a light emitting module having good optical characteristics. Moreover, recesses provided on the lightguide plate function as alignment marks when arranging the light emitting elements, and the heights of the light-transmitting members arranged in the recesses are adjusted to a uniform height, thereby reducing height variations between the light emitting elements placed thereon. Therefore, even when the lightguide plate has height variations, for example, the electrodes can be reliably exposed in the step of exposing the electrodes by removing the cover member.

The steps of the method of manufacturing the light emitting module 100 of the present embodiment will be described in detail below. FIG. 2A to FIG. 2L show an example of a method of manufacturing a light emitting module of the present embodiment.

(1) Providing a light emitting element including a semiconductor stack body and an electrode.

The light emitting element 40 is a light source of the light emitting module 100. A plurality of light emitting elements 40 are attached to one lightguide plate 10. As light emitting elements 40, necessary light emitting elements adapted to the size or target optical characteristics of the light emitting module 100 are provided. The light emitting elements 40 may be provided through a part or whole of the manufacturing process (e.g., through a step such as semiconductor growth), or through purchase, etc.

(2) Providing a lightguide plate having a first surface to be the light emitting surface and a second surface opposite to the first surface, wherein the second surface includes a plurality of recesses.

Figure 2A:
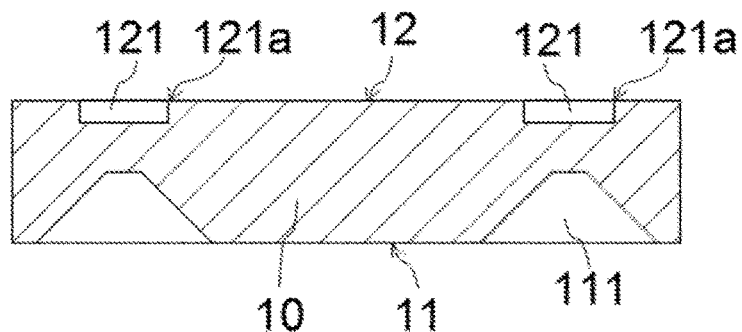
FIG. 2A is a partial enlarged schematic cross-sectional view showing a step in a method of manufacturing the light emitting module according to an embodiment of the present disclosure.

As shown in FIG. 2A, the lightguide plate 10 is provided. The lightguide plate 10 is a member for spreading light from the light emitting elements 40 into planar light, and is a generally plate-shaped member that has the first surface 11, which is the light-extracting surface, and the second surface 12 located opposite to the first surface 11.

As shown in FIG. 1C, the lightguide plate 10 has the recesses 121 on the second surface 12. In the example shown in FIG. 1C, each of the recesses 121 has a generally rectangular opening. The lightguide plate 10 may also have the optical functional sections 111 on the first surface 11. In this example, each of the optical functional sections 111 is depressed in a truncated cone shape.

(3) Arranging a light-transmitting member in each of the recesses, the light-transmitting member having an upper surface at a higher position than an upper end 121a of the recess.

Figure 2B:
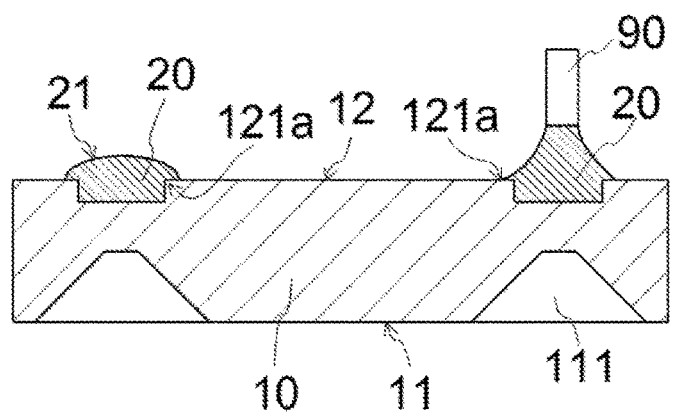
FIG. 2B is a partial enlarged schematic cross-sectional view showing a step in a method of manufacturing the light emitting module according to an embodiment of the present disclosure.

Next, the light-transmitting member 20 is arranged in each of the recesses 121. As shown in FIG. 2B, the light-transmitting member 20 is arranged so that the upper surface 21 of the light-transmitting member 20 is located at a higher position than an upper end 121a of the recess 121. The step may include a step of arranging the light-transmitting member so that the light-transmitting member 20 extends continuously onto the second surface 12 of the lightguide plate 10 around the recess 121. That is, the light-transmitting member 20 may be arranged so as to be larger than the opening of the recess 121 as seen from above.

(4) Adjusting upper surfaces of the light-transmitting members to a uniform height.

Figure 2C:
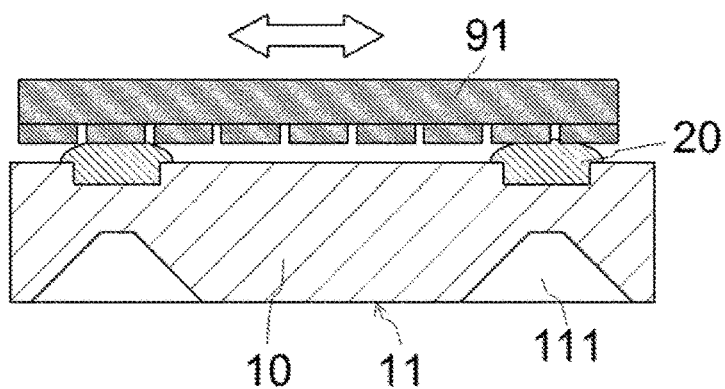
FIG. 2C is a partial enlarged schematic cross-sectional view showing a step in a method of manufacturing the light emitting module according to an embodiment of the present disclosure.
Figure 2D:
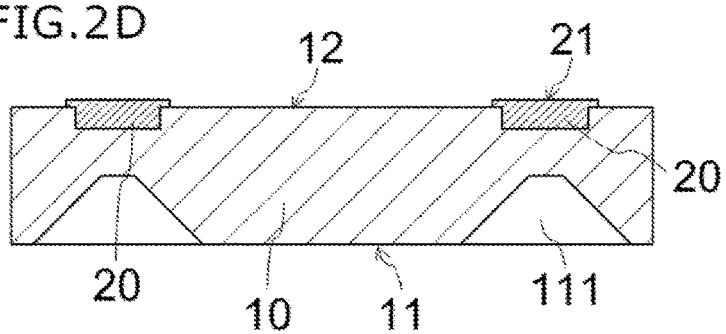
FIG. 2D is a partial enlarged schematic cross-sectional view showing a step in a method of manufacturing the light emitting module according to an embodiment of the present disclosure.

Next, as shown in FIG. 2C, the upper surfaces of the light-transmitting members 20 are adjusted to a uniform height. In the example illustrated herein, the light-transmitting members 20 are ground by using an abrasive member 91 such as a grindstone. Thus, as shown in FIG. 2D, the upper surfaces 21 of the light-transmitting members 20 are adjusted to a uniform height. Note that the "height" as used herein refers not to the thickness of the light-transmitting member 20 itself, but to the position of the upper surface 21 of the light-transmitting member 20 with respect to the second surface 12 of the lightguide plate 10.

As will be described later, the method of manufacturing the light emitting module 100 according to an embodiment of the present disclosure includes a step of forming a cover member 60 that covers the light emitting elements 40 placed on the lightguide plate 10, and then removing, through grinding, etc., a surface of the cover member 60 across the entire surface thereof, thereby exposing electrodes of the light emitting elements 40 (i.e., electrodes 42 in FIG. 2I, for example). It is advantageous that the electrodes are of a uniform height so that all the electrodes of the light emitting elements 40 are exposed in the step of exposing the electrodes. In this regard, it is beneficial to use the lightguide plate 10 with little warpage so that all the electrodes are exposed, as opposed to some electrodes being exposed with the other electrodes being not exposed when the cover member 60 is ground.

However, if the lightguide plate made of plastics has a size of, for example, about 75 cm to about 300 cm each side, a lightguide plate with no height variations (thickness variations) is unlikely to be obtained, but there are likely to be height variations of about 10 μm to about 50 μm. Therefore, the light-transmitting members 20 are formed at positions on the second surface 12 of the lightguide plate 10 where the light emitting elements 40 are to be placed, and the upper surfaces 21 of the light-transmitting members 20 are adjusted to a uniform height so that the light emitting elements 40 can be adjusted to a uniform height. Since the light-transmitting members 20 are located higher than the second surface 12 of the lightguide plate 10, it is possible to avoid grinding the lightguide plate 10 itself when grinding the light-transmitting members 20. The lightguide plate 10 is a member for spreading light from the light emitting element 40 in a planar direction, and if there are minute irregularities such as grinding marks, they are likely to diffuse light, thereby lowering the light transmission efficiency. Thus, it is preferred that there are fewer such grinding marks. With the method of manufacturing the light emitting module 100 according to an embodiment of the present disclosure, the light-transmitting members 20, which are arranged spaced apart from each other, are ground, instead of grinding the lightguide plate 10, and it is therefore possible to adjust the light-transmitting members 20 to a uniform height and to reduce the light loss due to grinding marks. Note that the method of adjustment to a uniform height may be pressing, instead of grinding as described above.

(5) Placing a wavelength conversion member on the light-transmitting member for absorbing light from the light emitting element and converting the light into light of a different wavelength.

Figure 2E:
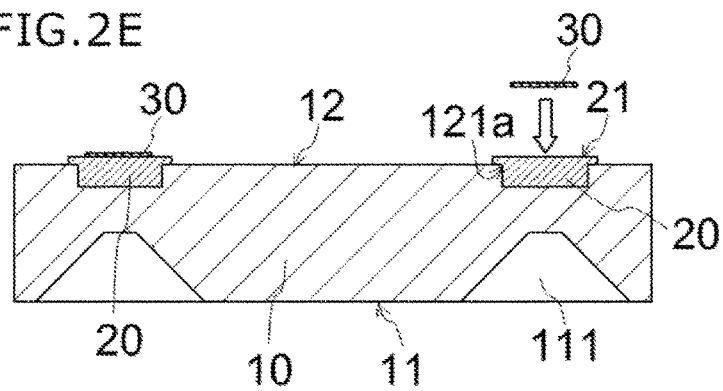
FIG. 2E is a partial enlarged schematic cross-sectional view showing a step in a method of manufacturing the light emitting module according to an embodiment of the present disclosure.

Next, as shown in FIG. 2E, the wavelength conversion members 30 are placed on the upper surfaces 21 of the light-transmitting members 20. It is advantageous if the wavelength conversion members 30 are pre-molded plate-shaped members. The pre-molded wavelength conversion members 30 can be screened in advance by measuring the chromaticity. Thus, it is possible to reduce variations of light from light emitting sections including the light emitting elements 40, thereby realizing a surface-emitting light emitting module that has little unevenness in emission color.

The wavelength conversion members 30 can be sucked and moved onto the light-transmitting members 20 by using suction collets, etc. In such a case, an adhesive may be placed in advance on the upper surfaces 21 of the light-transmitting members 20, and the wavelength conversion members 30 are placed thereon. When using an adhesive, the adhesive may be applied through dispensing tip (dispensing needle, dispensing nozzle, or the like), for example. In such a case, the transferred adhesive may have a thickness of about some μm to about some tens of μm.

(6) Placing the light emitting element on the wavelength conversion member with the electrode facing up.

Figure 2F:
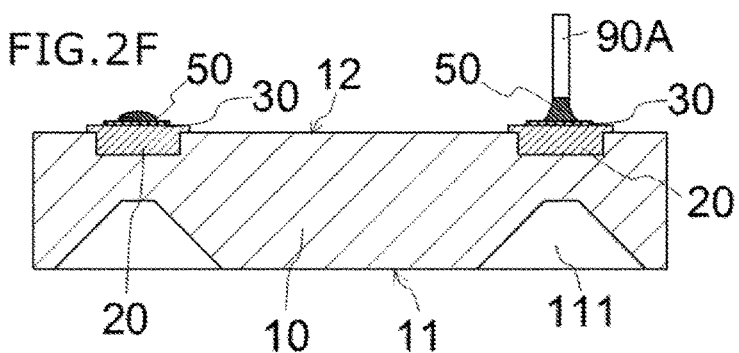
FIG. 2F is a partial enlarged schematic cross-sectional view showing a step in a method of manufacturing the light emitting module according to an embodiment of the present disclosure.

Next, as shown in FIG. 2F, the liquid-form bonding member 50 is applied on each wavelength conversion member 30. The bonding member 50 can be applied by a method such as potting, transfer, printing, etc. FIG. 2F illustrates a case where the bonding member 50 is applied by potting using a dispensing nozzle 90A.

Figure 2G:
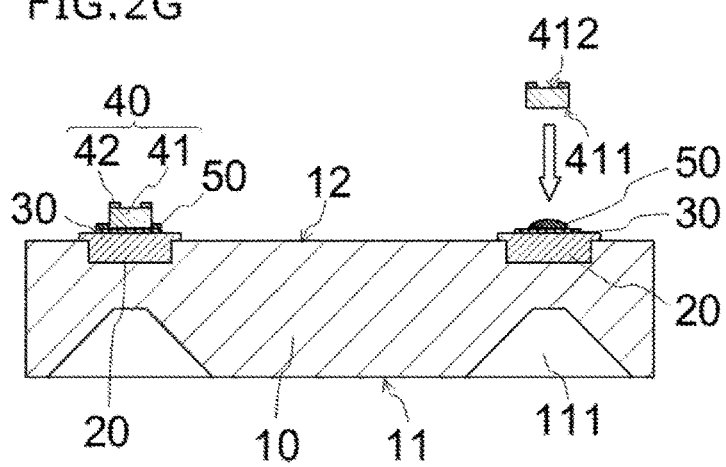
FIG. 2G is a partial enlarged schematic cross-sectional view showing a step in a method of manufacturing the light emitting module according to an embodiment of the present disclosure.

Next, as shown in FIG. 2G, the light emitting elements 40 are placed on the bonding members 50. In this process, the light emitting elements 40 are placed with the electrodes 42 facing up. That is, the light emitting elements 40 are placed with the electrode formation surfaces 412 facing up so that the primary light emitting surfaces 411 of the light emitting elements 40 and the bonding members 50 oppose each other. Then, the bonding members 50 are allowed to cure, thereby attaching the light emitting elements 40 to the light-transmitting members 20.

The light emitting elements 40 are arranged two-dimensionally as the lightguide plate 10 is seen from above. The light emitting elements 40 may be arranged two-dimensionally in two orthogonal directions, i.e., the x direction (horizontal direction) and the y direction (vertical direction). As shown in FIG. 1A, the arrangement pitch in the x direction and the arrangement pitch in the y direction of the light emitting elements 40, which are arranged so as to correspond to the optical functional sections 111, may be equal to each other or different from each other. The two directions of arrangement may not be orthogonal. The arrangement pitch in the x direction or the y direction is not limited to a regular pitch, but may be an irregular pitch. For example, the light emitting elements 40 may be arranged so that the interval therebetween increases from the center toward the periphery of the lightguide plate 10. Note that the pitch between the light emitting elements 40 is the distance between the optical axes of the light emitting elements 40. The pitch between the light emitting elements 40 may be about 0.05 mm to about 20 mm, for example, and is preferably about 1 mm to about 10 mm.

(7) Arranging a cover member that covers the light emitting element including the electrode.

Figure 2H:
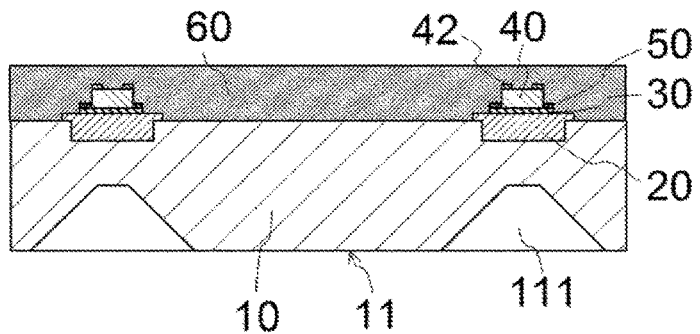
FIG. 2H is a partial enlarged schematic cross-sectional view showing a step in a method of manufacturing the light emitting module according to an embodiment of the present disclosure.

Next, as shown in FIG. 2H, the cover member 60 is formed that covers the second surface 12 of the lightguide plate 10 and the light emitting elements 40. The cover member 60 may be formed by a method such as transfer molding, potting, printing, spraying, etc., for example. In this process, the cover member 60 is formed to be thick so as to completely cover the upper surfaces of the electrodes 42 of the light emitting elements 40.

(8) Removing a part of the cover member until the electrode is exposed.

Figure 2I:
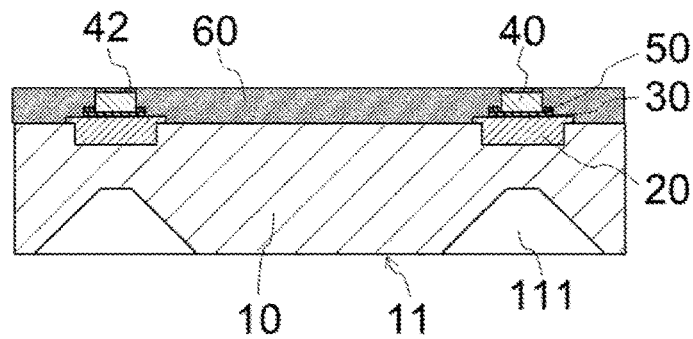
FIG. 2I is a partial enlarged schematic cross-sectional view showing a step in a method of manufacturing the light emitting module according to an embodiment of the present disclosure.

Next, as shown in FIG. 2I, the surface of the cover member 60 is ground across the entire surface thereof, thereby exposing the electrodes 42 of the light emitting elements 40. As the method of grinding, the cover member 60 may be ground to a plane by using an abrasive member such as a grindstone. Since the upper surfaces 21 of the light-transmitting members 20, on which the light emitting elements are placed, are adjusted to a uniform height, the electrodes 42 of the light emitting elements 40 can be all exposed.

(9) Forming a wiring that electrically connects the light emitting elements together.

Figure 2J:
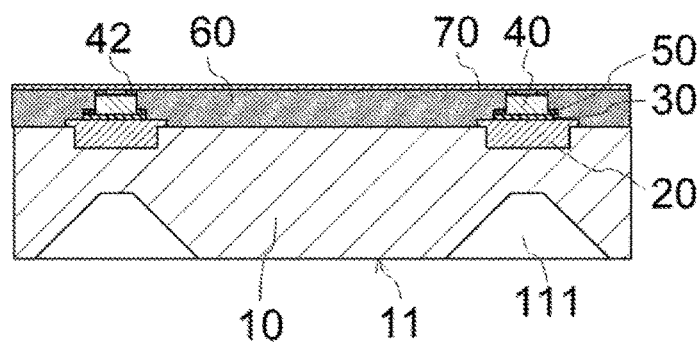
FIG. 2J is a partial enlarged schematic cross-sectional view showing a step in a method of manufacturing the light emitting module according to an embodiment of the present disclosure.

Next, as shown in FIG. 2J, a metal film is formed across substantially the entire surface of the cover member 60 and the electrodes 42 of the light emitting elements 40. The metal film may have a layered structure including Cu/Ni/Au layered in this order starting from the lightguide plate 10 side, for example. The method of formation of the metal film includes sputtering, plating, etc., and the metal film is preferably formed by sputtering.

Figure 2K:
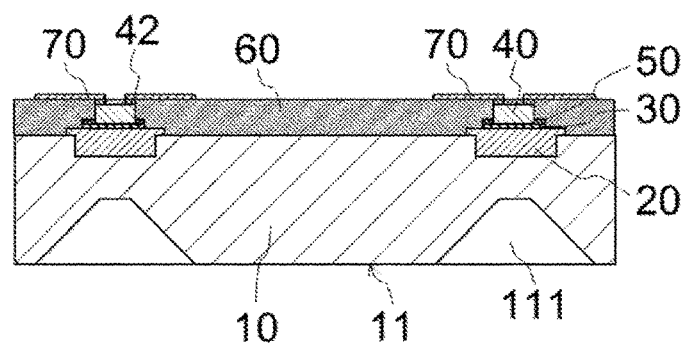
FIG. 2K is a partial enlarged schematic cross-sectional view showing a step in a method of manufacturing the light emitting module according to an embodiment of the present disclosure.

Next, the metal film is patterned by laser abrasion by irradiating the metal film with laser light and removing the irradiated portions of the metal film, thereby forming the conductive members 70 as shown in FIG. 2K.

Figure 2L:
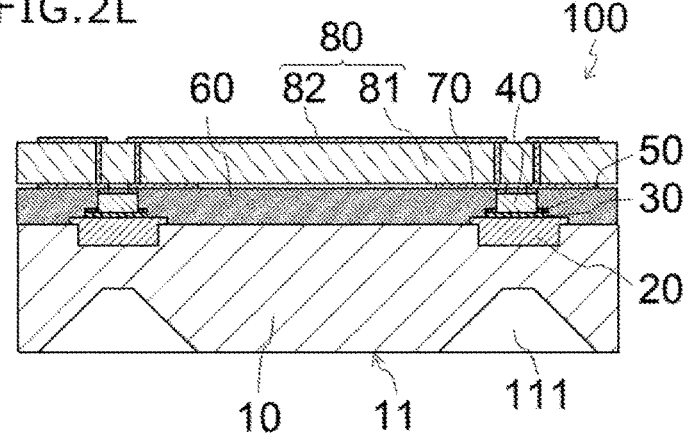
FIG. 2L is a partial enlarged schematic cross-sectional view showing a step in a method of manufacturing the light emitting module according to an embodiment of the present disclosure.

Next, as shown in FIG. 2L, the conductive members 70 and a wiring 82 of a wiring board 80, which is separately provided, are bonded together. In this process, an adhesive sheet may be interposed between the cover member 60 and the wiring board 80. The wiring board 80 may have a plurality of throughholes filled with a conductive material (via fill) as shown in FIG. 2L. The conductive members 70 and the wiring 82 may be electrically connected to each other by partially melting, using pressure and heat, the conductive material placed in those throughholes. The via fill may be portions of the wiring 82. Thus, the light emitting module 100 of the present embodiment can be obtained.

The light emitting elements 40 may be wired so that they operate independently of each other. Alternatively, the lightguide plate 10 may be divided into a plurality of areas so that a number of light emitting elements 40 in each area are treated as a group, wherein the light emitting elements 40 of each group are electrically connected to each other in series or in parallel, thereby connecting the light emitting elements 40 to the same circuit, so that there are a plurality of groups of light emitting elements. With such grouping, it is possible to realize a light emitting module capable of local dimming.

One light emitting module 100 of the present embodiment may be used as the backlight of one liquid crystal display device. Alternatively, an array of light emitting modules 100 may be used as the backlight of one liquid crystal display device. By producing and individually testing a plurality of small light emitting modules, and then integrating them, it is possible to improve the production yield as compared with a case where one large light emitting module with a large number of light emitting elements 40 are produced.

One light emitting module 100 may be attached to one wiring board 80. Alternatively, a plurality of light emitting modules 100 may be attached to one wiring board 80. Then, terminals (e.g., connectors) for electric connection to the outside can be conserved (i.e., no need to provide them for each light emitting module), making it possible to simplify the structure of the liquid crystal display device etc.

A plurality of wiring boards 80, each including a plurality of light emitting modules 100 attached thereto, may be arranged in an array to be the backlight of one liquid crystal display device. In such a case, for example, a plurality of wiring boards 80 can be placed on a frame, or the like, and each wiring board 80 can be connected to an outside power supply using a connector, or the like.

Embodiment 2

Figure 3:
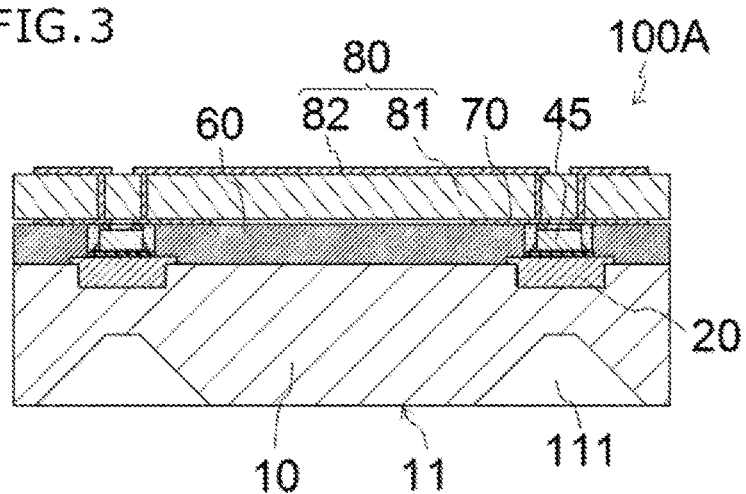
FIG. 3 is a partial enlarged schematic cross-sectional view of the light emitting module according to another embodiment of the present disclosure.

FIG. 3 shows the configuration of a light emitting module 100A according to another embodiment of the present embodiment. The light emitting module 100A is obtained by placing light source members 45, each including a wavelength conversion member and a light emitting element, on the light-transmitting members 20. Otherwise, the configuration is similar to that of the light emitting module 100 of Embodiment 1.

A method of manufacturing the light emitting module 100A of the present embodiment includes the following steps:

(1a) providing a light source member including a light emitting element, which includes a semiconductor stack body and an electrode, and a wavelength conversion member for absorbing light from the light emitting element and converting the light into light of a different wavelength;

(2) providing a lightguide plate having a first surface to be the light emitting surface and a second surface opposite to the first surface, wherein the second surface includes a plurality of recesses;

(3) arranging a light-transmitting member in each of the recesses, the light-transmitting member having upper surface at a higher position than an upper end of the recess;

(4) adjusting upper surfaces of the light-transmitting members to a uniform height;

(5-6) placing the light source member on the light-transmitting member with the electrode facing up;

(7a) arranging a cover member that covers the light source member including the electrode;

(8a) removing a part of the cover member until the electrode is exposed; and (9a) forming a wiring that electrically connects the light source members together.

These steps will now be described focusing on steps that are different from those of Embodiment 1, while omitting redundant descriptions.

(1a) Providing a light source member including a light emitting element, which includes a semiconductor stack body and an electrode, and a wavelength conversion member for absorbing light from the light emitting element and converting the light into light of a different wavelength.

Figure 4:
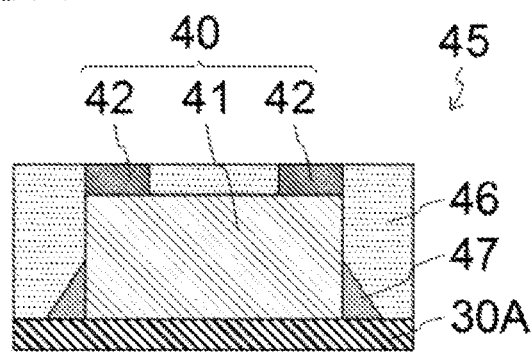
FIG. 4 is a schematic cross-sectional view showing an example of a light source member of the light emitting module according to another embodiment of the present disclosure.

The light source member 45 is a member including the light emitting element 40, which is the light source of the light emitting module 100A. In the present embodiment, the light emitting element 40 is integrated with a wavelength conversion member 30A in advance. FIG. 4 shows an example of the light source member 45, and the light source member 45 includes the wavelength conversion member 30A on the primary light emitting surface side of the light emitting element 40. The light source member 45 also includes the electrode 42 on the opposite side from the wavelength conversion member 30A. The electrode 42 may be the electrode of the light emitting element 40 being exposed to the outside of the light source member 45. Alternatively, the electrode 42 may be a metal film that covers the electrode of the light emitting element.

The light source member 45 as described above may be provided through purchase, or the like, or through a part or whole of the manufacturing process, e.g., a step of integrating the wavelength conversion member 30A and the light emitting element 40 together.

Figure 5A:
FIG. 5A is a partial enlarged schematic cross-sectional view showing a step in a method of manufacturing the light source member.

FIG. 5A to FIG. 5F show an example of a method of manufacturing the light source member 45. First, as shown in FIG. 5A, the flat plate-shaped wavelength conversion member 30A is provided. Herein, the wavelength conversion member 30A is provided of a size such that a plurality of light emitting elements 40 can be placed thereon. For example, where rectangular light emitting elements 40 having a shape of 500 µm×500 µm as seen from above are used, the wavelength conversion member 30A that is 60 mm×60 mm as seen from above may be used.

Figure 5B:
FIG. 5B is a partial enlarged schematic cross-sectional view showing a step in a method of manufacturing the light source member.

Next, a plurality of lightguide members 47 are arranged on the wavelength conversion member 30A. The lightguide members 47 are light-transmitting members that attach the wavelength conversion member 30A and the light emitting elements 40 together. As the method of arranging the lightguide members 47, for example, a liquid-form lightguide member 47 may be applied onto the wavelength conversion member 30A by using a dispensing nozzle 90B as shown in FIG. 5B. Alternatively, methods such as pin transfer (depositing a semi-solid or liquid material using pins) and printing can be used. The lightguide members 47 are arranged so as to be spaced apart from each other.

Figure 5C:
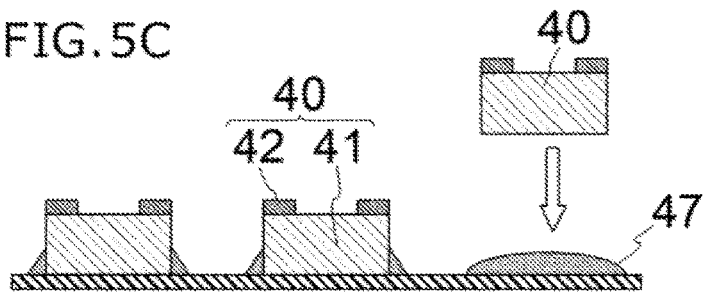
FIG. 5C is a partial enlarged schematic cross-sectional view showing a step in a method of manufacturing the light source member.

Next, as shown in FIG. 5C, the light emitting elements 40 are placed on the lightguide members 47. In the process, the light emitting elements 40 are placed with the electrodes 42 thereof facing up. In other words, the light emitting elements 40 are placed so that the primary light emitting surface side (or the semiconductor stack body 41 side) of the light emitting element 40 opposes the lightguide member 47. In this process, the lightguide member 47 may be in contact with the lateral surface of the light emitting element 40.

Figure 5D:
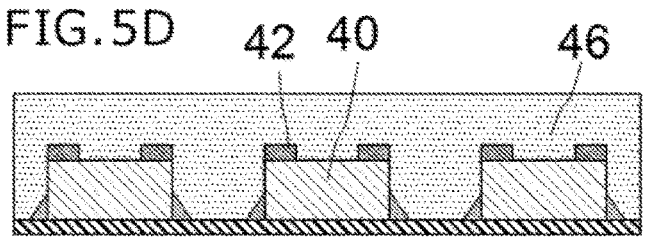
FIG. 5D is a partial enlarged schematic cross-sectional view showing a step in a method of manufacturing the light source member.

Next, as shown in FIG. 5D, an encapsulation member 46 is arranged so as to cover the light emitting elements 40 and the lightguide members 47. The electrodes 42 of the light emitting elements may also be covered by the encapsulation member 46.

Figure 5E:
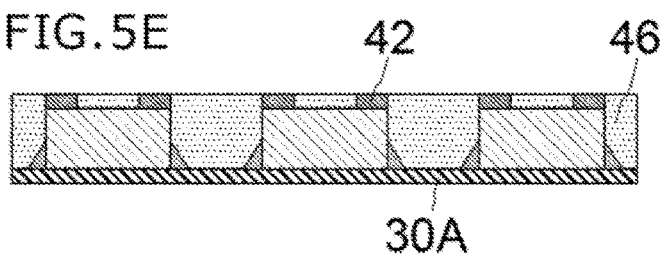
FIG. 5E is a partial enlarged schematic cross-sectional view showing a step in a method of manufacturing the light source member.

Next, as shown in FIG. 5E, a part of the encapsulation member 46 is removed so as to expose the electrodes 42 of the light emitting elements 40.

Figure 5F:
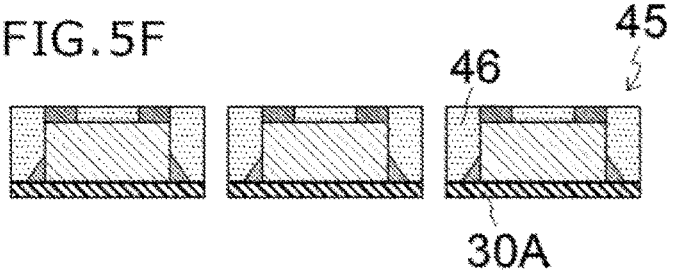
FIG. 5F is a partial enlarged schematic cross-sectional view showing a step in a method of manufacturing the light source member.

Next, as shown in FIG. 5F, the encapsulation member and the wavelength conversion member 30A are cut off between adjacent light emitting elements 40, thereby obtaining a plurality of the light source members 45.

The following steps, i.e., (2) providing the lightguide plate 10, (3) arranging a light-transmitting member, and (4) adjusting upper surfaces of light-transmitting members to a uniform height, are similar to Embodiment 1.

(5-6) Placing the light source member on the light-transmitting member with the electrode facing up.

Figure 6A:
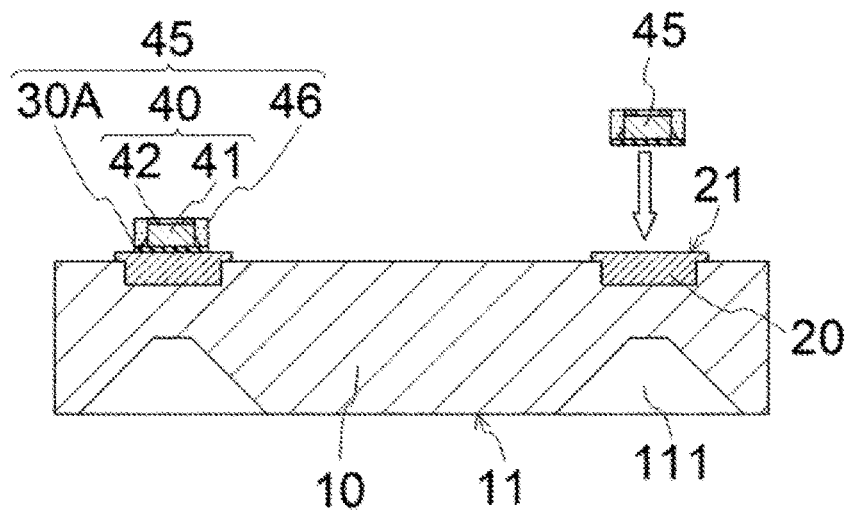
FIG. 6A is a partial enlarged schematic cross-sectional view showing a step in a method of manufacturing the light emitting module according to another embodiment of the present disclosure.

Next, as shown in FIG. 6A, the light source members 45 are placed on the light-transmitting members 20. In this process, the material of the bonding member may be applied in advance on the light-transmitting members 20. The material of the bonding member can be applied by a method such as potting, transfer, printing, etc. The light source members are placed on the upper surfaces 21 of the light-transmitting members 20 with the electrodes of the light source members 45 (e.g., the electrode 42 of the light emitting element) facing up. That is, the light source members 45 are placed so that the wavelength conversion members 30A and the light-transmitting members 20 oppose each other. Then, the material of the bonding member is allowed to cure, thereby attaching the light source members 45 to the light-transmitting members 20.

(7a) Arranging a cover member that covers the light source member including the electrode.

Figure 6B:
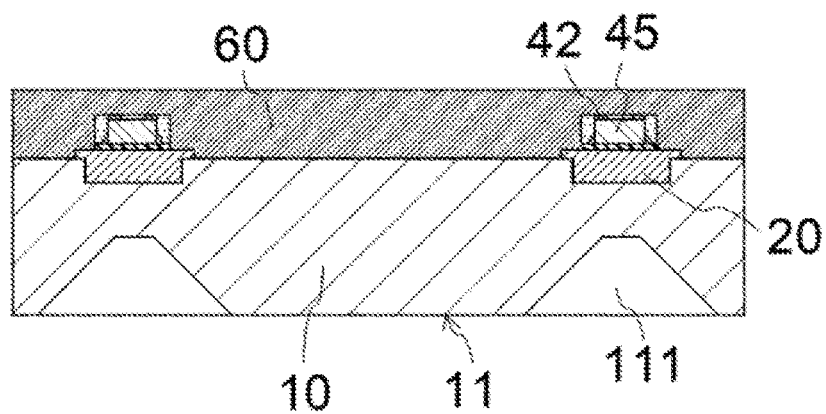
FIG. 6B is a partial enlarged schematic cross-sectional view showing a step in a method of manufacturing the light emitting module according to another embodiment of the present disclosure.

Next, as shown in FIG. 6B, the cover member 60 is formed that covers the second surface 12 of the lightguide plate 10 and the light source members 45. The cover member 60 may be formed by a method such as transfer molding, potting, printing, spraying, etc., for example. Typically, the cover member 60 is formed to be thick so as to completely cover the upper surfaces of the electrodes 42 of the light source members 45.

(8a) Removing a part of the cover member until the electrode is exposed.

Figure 6C:
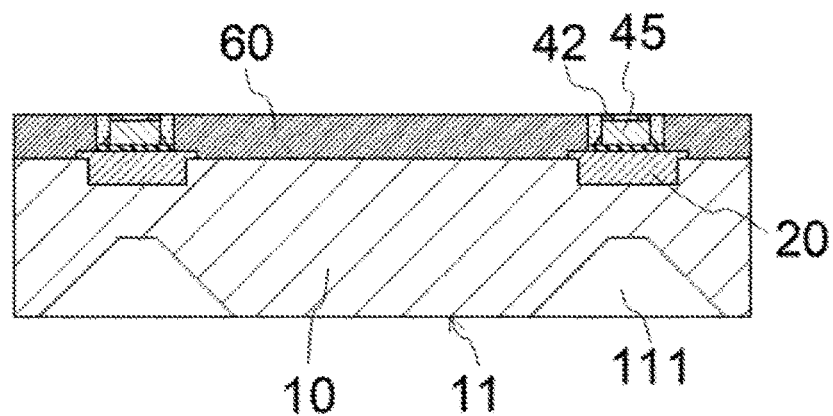
FIG. 6C is a partial enlarged schematic cross-sectional view showing a step in a method of manufacturing the light emitting module according to another embodiment of the present disclosure.

Next, as shown in FIG. 6C, the surface of the cover member 60 is ground across the entire surface thereof, thereby exposing the electrodes 42 of the light source members 45. As the method of grinding, the cover member 60 may be ground to a plane by using an abrasive member such as a grindstone. Since the upper surfaces 21 of the light-transmitting members 20, on which the light source members 45 are placed, are adjusted to a uniform height, the electrodes 42 of the light source members 45 can be all exposed.

(9a) Forming a wiring that electrically connects the light source members together.

Figure 6D:
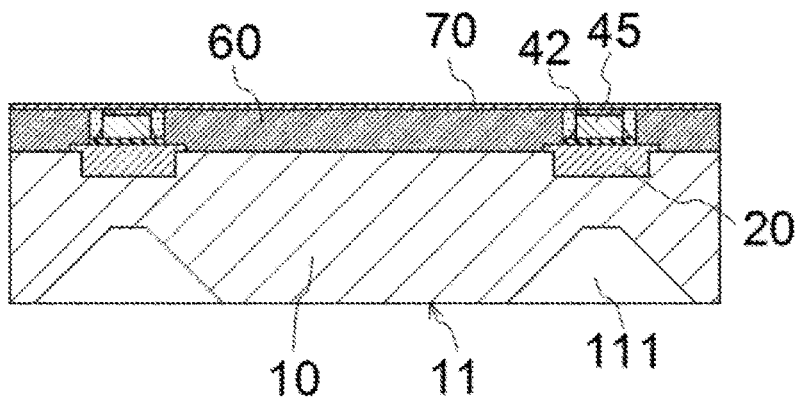
FIG. 6D is a partial enlarged schematic cross-sectional view showing a step in a method of manufacturing the light emitting module according to another embodiment of the present disclosure.

Next, as shown in FIG. 6D, a metal film is formed across substantially the entire surface of the cover member 60 and the electrodes 42 of the light source members 45. The metal film may have a layered structure including Cu/Ni/Au layered in this order starting from the lightguide plate 10 side, for example. The method of formation of the metal film includes sputtering, plating, etc., and the metal film is preferably formed by sputtering.

Figure 6E:
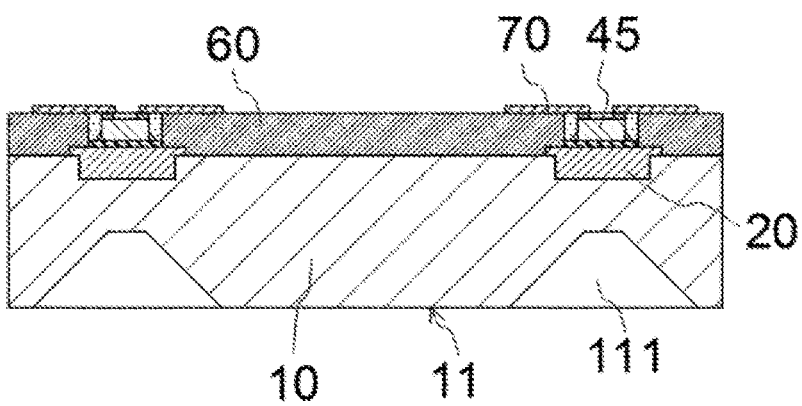
FIG. 6E is a partial enlarged schematic cross-sectional view showing a step in a method of manufacturing the light emitting module according to another embodiment of the present disclosure.
Figure 6F:
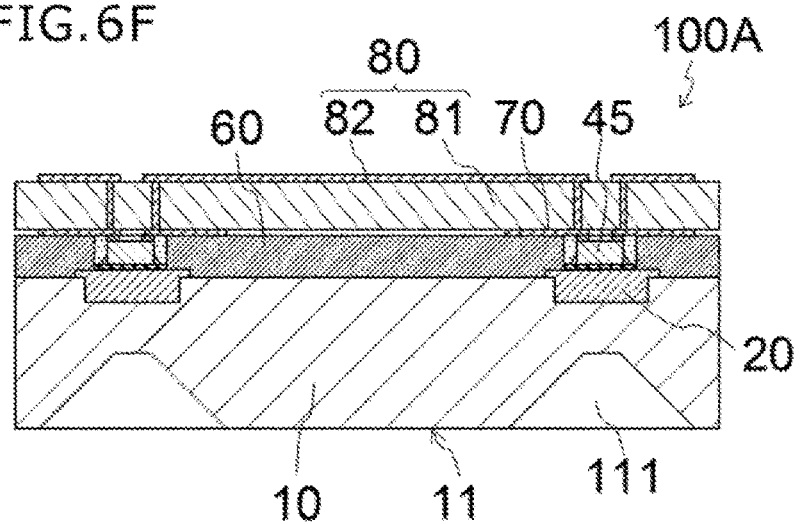
FIG. 6F is a partial enlarged schematic cross-sectional view showing a step in a method of manufacturing the light emitting module according to another embodiment of the present disclosure.

Next, the metal film is patterned by laser abrasion by irradiating the metal film with laser light and removing the irradiated portions of the metal film, thereby forming the conductive members 70 as shown in FIG. 6E. Next, as shown in FIG. 6F, the wiring board 80, which is separately provided, are attached to the assemblage including the light source members 45, the cover member 60 and the lightguide plate 10. In this process, an adhesive sheet may be interposed between the cover member 60 and the wiring board 80, then the wiring board 80 is compressively attached to the assemblage. The conductive members 70 and the wiring 82 may be electrically connected to each other by partially melting, using pressure and heat, the via fill provided in the insulative base 81. Thus, the light emitting module 100A of the present embodiment can be obtained.

In Embodiment 2, the light source member 45 includes the light emitting element 40 and the wavelength conversion member 30A. Therefore, the light source member 45 can be screened in advance according to the chromaticity, etc., of light emitted from the light source member 45. Thus, it is possible to realize a light source module that is thin and has little unevenness in emission color.

Members of the light emitting module will now be described in detail.

Light Emitting Element 40

A semiconductor light emitting element known in the art can be used as the light emitting element 40. In the embodiments described above, a light emitting diode is illustrated as the light emitting element 40. The light emitting element 40 has the primary light emitting surface 411 from which light emission is primarily extracted, and includes a pair of electrodes 42 on the electrode formation surface 412, which is opposite to the primary light emitting surface 411. The light emitting module according to a certain embodiment may include the wiring board 80 having the wiring 82. In that case, electrodes 42 are arranged so as to oppose the wiring board 80, and is electrically connected to the wiring 82 of the wiring board 80 optionally with the conductive member 70, or the like, interposed therebetween.

The light emitting element 40 includes the semiconductor stack body 41 including a light-transmitting substrate of sapphire, or the like, and semiconductor layers on the light-transmitting substrate, for example. The semiconductor stack body 41 includes a light emitting layer, and an n-type semiconductor layer and a p-type semiconductor layer with the light emitting layer sandwiched therebetween, wherein an n-side electrode and a p-side electrode are electrically connected to the n-type semiconductor layer and the p-type semiconductor layer, respectively. For example, the primary light emitting surface 411 of the light emitting element 40 includes the light-transmitting substrate, and the primary light emitting surface 411 is arranged so as to oppose the lightguide plate.

The light emitting element 40 may be an element that emits light of any wavelength. For example, an element that emits blue light or green light may be a light emitting element that includes a nitride-based semiconductor ($In_xAl_yGa_{1-x-y}N$, $0 \leq x$, $0 \leq y$, $x+y \leq 1$) or GaP. An element that emits red light may be a light emitting element that includes a semiconductor such as GaAlAs or AlInGaP. Moreover, semiconductor light emitting elements made of other materials may be used. The emission wavelength can be selected from among various emission wavelengths based on the material and the mixed crystal ratios of the semiconductor layer. The composition, the color of emission, the size, the number, etc., of light emitting elements used may be selected appropriately depending on the purpose. When the light emitting module includes a wavelength conversion member, it is preferred that the light emitting element 40 includes a nitride semiconductor ($In_xAl_yGa_{1-x-y}N$, $0 \leq x$, $0 \leq y$, $x+y \leq 1$) capable of emitting light of a short wavelength with which the wavelength conversion member can be excited efficiently.

For example, the size of the light emitting element 40 is preferably 1000 µm or less, more preferably 500 µm or less, and even more preferably 200 µm or less, along the x and y directions as seen from above. Such a structure of a light emitting element allows to present a high-definition image when local dimming is applied to, for example, the liquid crystal display device.

Lightguide Plate 10

The lightguide plate 10 is a light-transmitting plate-shaped member that receives light from light emitting elements and gives a planar light emission. The lightguide plate 10 has the first surface 11 to be the light emitting surface, the second surface 12 opposite to the first surface 11.

For example, the size of the lightguide plate 10 is about 1 cm to about 200 cm each side, and preferably about 3 cm to about 30 cm each side. The thickness may be about 0.1 mm to about 5 mm, and is preferably 0.5 mm to 3 mm. Note that where the first surface 11 or the second surface 12 has recesses, protruding portions, etc., the "thickness" as used herein refers to the thickness without such portions. The planar shape of the lightguide plate 10 may be a generally rectangular shape, a generally circular shape, etc., for example.

The material of the lightguide plate 10 may be a resin material such as a thermoplastic resin such as acrylic, polycarbonate, cyclic polyolefin, polyethylene terephthalate and polyester or a thermosetting resin such as epoxy and silicone, or an optically transparent material such as glass. A thermoplastic resin material is particularly preferred because it can be manufactured efficiently by, for example, injection molding. Among others, polycarbonate, which is highly transparent and inexpensive, is preferred. With the method of manufacturing a light emitting device of the embodiments according to the present disclosure, where the wiring board is attached after the light emitting element 40 is attached to the lightguide plate 10, a step such as solder reflow in which a high temperature is used can be omitted, making it possible to use even a material that is thermoplastic and has a low heat resistance such as polycarbonate.

The lightguide plate 10 can be formed by injection molding, transfer molding, thermal transfer, or the like, for example. The optical functional sections 111 and the recesses 121 of the lightguide plate 10 can be molded at once. Then, it is possible to reduce the molding misalignment of the optical functional sections 111 and the recesses 121.

The lightguide plate 10 may be a single layer, or may include a plurality of light-transmitting layers that are layered together. When a plurality of light-transmitting layers are layered together, a layer having a different refractive index, e.g., an air layer, or the like, may be provided between any layers. Then, light can be diffused more easily, and it is possible to realize a light emitting module with reduced unevenness in luminance. Such a configuration can be realized by providing spacers between any light-transmitting layers, thereby spacing them apart and providing an air layer therebetween.

Optical Functional Section

The lightguide plate 10 may include the optical functional sections 111 on the first surface 11 side. The optical functional sections 111 can have the function of spreading light in the plane of the lightguide plate 10, for example.

The optical functional section 111 may be a cone-shaped or truncated cone-shaped depression provided on the first surface 11 side. A cone-shaped depression may be in the shape of a cone or a polygonal pyramid such as a quadrangular pyramid or a hexagonal pyramid, and a truncated cone-shaped depression may be in the shape of a truncated cone or a truncated polygonal pyramid such as a truncated quadrangular pyramid or a truncated hexagonal pyramid. With a truncated cone-shaped depression, the size of a top face (i.e., a portion corresponding to the apex) as seen from above can be 100% to 500% the size of the light emitting element 40 as seen from above.

A material (e.g., air) having a different refractive index from the lightguide plate 10 can be placed in these depressions. A light-reflective material (e.g., a reflective film of a metal, or the like, or a white resin), etc., may be provided in the depressions. The slope of the optical functional section 111 may be straight or curved as seen in a cross section.

It is beneficial that the optical functional section 111 is provided so as to correspond to the light emitting element 40, i.e., provided at a position opposite from the light emitting element 40 arranged on the second surface 12. Particularly, it is preferred that the optical axis of the light emitting element 40 generally coincides with the optical axis of the optical functional section 111. For example, where the depression of the optical functional section 111 has a cone shape, the apex generally coincides with the optical axis of the light emitting element 40. Where the depression of the optical functional section 111 has a truncated cone shape, it is preferred that the optical axis of the light emitting element 40 intersects the surface corresponding to the apex of the truncated cone shape.

The size of the optical functional section 111 can be set appropriately. FIG. 1B illustrates an example of the optical functional section 111 in the form of a truncated cone-shaped recess having a circular opening on the first surface 11, and the diameter of the opening is larger than the wavelength conversion member 30.

Recess

The lightguide plate 10 includes the recess 121 on the second surface 12 side. The recess 121 is a portion that is the target position at which the light emitting element 40 is arranged. The size of the recess 121 as seen from above can be 0.05 mm to 10 mm, for example, and is preferably 0.1 mm to 1 mm. The depth can be 0.05 mm to 4 mm, and is preferably 0.1 mm to 1 mm. The distance between the optical functional section 111 and the recess 121 can be set appropriately within the range for which the optical functional section 111 and the recess 121 are spaced apart from each other.

The shape of the recess 121 as seen from above may be a generally rectangular shape or a generally circular shape, and can be selected based on the arrangement pitch of the recesses (the distance between two nearest neighbor recesses), etc. Where the arrangement pitch of the recesses is generally even, a generally circular or a generally square shape is preferred. Among others, with a generally circular shape, it is possible to effectively spread light from the light emitting element 40.

Light-Transmitting Member

The light-transmitting member 20 serves to transmit light emitted from the light emitting element 40 to the lightguide plate 10. The light-transmitting member 20 is arranged in the recess 121 on the second surface 12 side of the lightguide plate 10. The upper surface 21 of the light-transmitting member 20 is at a higher position than the upper end 121a of the recess 121. The distance between the upper surface 21 of the light-transmitting member 20 after grinding and the second surface 12 of the lightguide plate 10 (the height of the upper surface 21 of the light-transmitting member 20 from the second surface 12) can be 10 μm to 100 μm. The upper surfaces 21 of the light-transmitting members 20 have an even height directly above the recesses 121. For example, the light-transmitting members 20 arranged in the recesses 121 are located so that the upper surfaces 21 are at generally an equal height.

The size of the light-transmitting member 20 as seen from above may be larger than the size of the opening of the recess 121. That is, rather than being arranged only inside the recess 121, the light-transmitting member 20 may be arranged so as to extend onto the second surface 12 including the upper end 121a of the recess 121. Note that the light-transmitting members 20 arranged in a plurality of recesses 121 are preferably spaced apart from each other. Therefore, the size of the light-transmitting member 20 as seen from above can be about 100% to 300% the size of the opening of the recess 121.

Where the depressed optical functional section 111 is provided on the first surface 11 of the lightguide plate 10, the size of the recess 121 as seen from above can be smaller than the size of the optical functional section 111. Then, light from the light emitting element 40 can be efficiently spread in the horizontal direction by means of the optical functional section 111.

A portion of the light-transmitting member 20 that extends onto the second surface 12 of the lightguide plate 10 may have the same height as the portion that is located directly above the recess 121. Alternatively, the height of a portion of the light-transmitting member 20 that extends onto the second surface 12 may be lower than the height of the portion that is located directly above the recess 121.

The light-transmitting members 20 is light-transmitting and allows 60% or more, preferably 90% or more, of light emitted from the light emitting element 40 to pass therethrough. The light-transmitting member 20 is preferably made of a material having about the same refractive index as the material of the lightguide plate 10. For example, the base material of the light-transmitting member 20 may be an epoxy resin, a silicone resin, a mixed resin thereof, or a light-transmitting material such as glass. In view of the moldability and the resistance to photo-degradation, it is advantageous to select a silicone resin as the base material of the light-transmitting member 20.

Wavelength Conversion Member

The wavelength conversion member 30, 30A arranged on the light-transmitting member 20, which is arranged on the second surface 12 side of the lightguide plate 10, is a member that contains a phosphor for converting light from the light emitting element 40 into light of a different wavelength. The wavelength conversion member has a shape of a plate whose thickness is generally even, and the thickness is 100 µm to 200 µm, for example.

The size of the wavelength conversion member as seen from above may be smaller than the size of the light-transmitting member 20. Furthermore, the size of the wavelength conversion member as seen from above is preferably smaller than the size of the opening of the recess 121. The size of the wavelength conversion member as seen from above is advantageously larger than the light emitting element 40.

The wavelength conversion member includes a light-transmitting material having a higher refractive index than the material of the lightguide plate 10 as the base material, and a granular phosphor as the wavelength conversion substance, for example. The base material of wavelength conversion member may be an epoxy resin, a silicone resin, a mixed resin thereof, or a light-transmitting material such as glass. In view of the moldability and the resistance to photo-degradation, it is advantageous to select a silicone resin as the base material of the wavelength conversion member.

The phosphor may be a YAG-based phosphor, a β-SiAlON phosphor or a fluoride-based phosphor such as a KSF-based phosphor, for example. One wavelength conversion member may include one or more types of phosphors. For example, the light emitting element 40 that emits light of bluish color may be used, and a β-SiAlON phosphor that emits light of greenish color and a fluoride-based phosphor such as a KSF-based phosphor that emits light of reddish color may be used as phosphors. By using such two types of phosphors, it is possible to expand the color reproduction range of the light emitting module. The phosphor may be a quantum dot phosphor.

The phosphor may be in any arrangement inside the wavelength conversion member. For example, the phosphor may be distributed generally evenly, or unevenly, inside the wavelength conversion member. Phosphors of different types may be mixed together or layered together.

The wavelength conversion member 30 may include a light-diffusing substance. The light-diffusing substance may be fine particles of $SiO_2$, $TiO_2$, $Al_2O_3$, ZnO, or the like, for example.

Bonding Member

The bonding member 50 is a member that attaches the light emitting element 40 and the wavelength conversion member 30 together. The bonding member 50 is light-transmitting, and allows 60% or more, preferably 90% or more, of light emitted from the light emitting element 40 to pass therethrough. The bonding member 50 may include a diffusion member (e.g., diffusive particles), or the like, or may be formed from a light-transmitting resin material that does not include a diffusion member, or the like.

The bonding member 50 may cover the lateral surface of the light emitting element 40 (the surface that connects the primary light emitting surface 411 and the electrode formation surface 412 together). Then, it is possible to efficiently extract light emitted in the lateral surface direction of the light emitting element 40 into the bonding member 50, thereby increasing the emission efficiency of the light emitting module.

The material of the bonding member 50 may be a light-transmitting thermosetting resin material such as an epoxy resin or a silicone resin, etc.

Cover Member

The cover member 60 covers the lateral surface of the light emitting elements 40, the second surface 12 of the lightguide plate 10, and the lateral surface of the bonding members 50. Thus, it is possible to reinforce the lightguide plate 10 with the light emitting elements 40 attached. The cover member 60 is advantageously a light reflective member. When the cover member 60 is a light reflective member, light emitted from the light emitting element 40 can be efficiently taken into the lightguide plate 10.

The cover member 60, being a light reflective member, has a reflectivity of 60% or more, preferably a reflectivity of 90% or more, for light emitted from the light emitting element 40. The material of the cover member 60, being a light reflective member, is advantageously a resin material that contains a white pigment, or the like. Particularly, it is preferred to use a silicone resin that contains titanium oxide. By using an inexpensive material such as titanium oxide as a material that is used in a relatively large quantity to cover the entire surface of the lightguide plate 10, it is possible to make the light emitting module inexpensive.

Conductive Member

The light emitting module may include the conductive member 70 that is electrically connected to the electrodes 42 of the light emitting elements. The conductive member 70 is arranged so as to cover the lower surface of the cover member 60 and the lower surface of the electrodes 42. With the provision of the conductive member 70, a plurality of light emitting elements 40 can be electrically connected together, for example, and it is possible to easily form a circuit needed for local dimming, etc., of a liquid crystal display device.

Wiring Board

The light emitting module may include the wiring board 80 as shown in FIG. 1B. The wiring board 80 includes an insulative base 81, and the wiring 82 electrically connected to the light emitting elements 40, etc. With the provision of the wiring board 80, it is possible to easily form complicated wirings that are needed for local dimming, etc. The wiring board 80 can be provided separately, and the wiring 82 of the wiring board 80 is connected to the conductive members 70, after mounting the light emitting elements 40 on the lightguide plate 10 and forming the cover member 60 and the conductive members 70. When providing the conductive members 70 to be connected to the light emitting elements 40, the conductive members 70 are formed to have a shape that is larger than the planar shape of the electrodes 42 of the light emitting elements, thereby making it easy to electrically connect the wiring board 80 and the light emitting elements 40 together via the conductive members 70.

As shown in FIG. 1B, the insulative base 81 may have a plurality of via holes each filled with a conductive member. These conductive members are electrically connected to the wiring 82. In the example shown in FIG. 1B, the wiring 82 is disposed on one side of the insulative base 81 which is opposite to the side facing the lightguide plate 10. In that case, via holes electrically connects the wiring 82 and the electrodes 42 of the light emitting elements together.

The wiring 82 is a conductive foil (conductive layer) provided on the base 81 for example. The wiring 82 is electrically connected to a plurality of light emitting elements 40. It is preferred that the material of the wiring has a high thermal conductivity. Examples of such a material include a conductive material such as copper, for example.

The wiring 82 may be formed by plating or conductive paste application or printing, etc., and the thickness of the wiring 82 is about 5 µm to about 50 µm, for example.

The material of the base 81 of the wiring board 80 may be a ceramic or a resin, for example. In view of the low cost and moldability, a resin may be selected as the material of the base 81. Examples for the material of the base 81 include phenolic resin, epoxy resin, polyimide resin, BT resin, polyphthalamide (PPA), polyethylene terephthalate (PET), unsaturated polyester. The base 81 may formed of a composite material such as glass epoxy, etc. The base 81 may be a rigid substrate or a flexible substrate.

The wiring board 80 may be attached to the lightguide plate 10 by any method. For example, the attachment can be achieved by arranging and pressure-bonding an adhesive sheet between the surface of the cover member 60 provided on the opposite side of the lightguide plate 10 and the surface of the wiring board 80. The electric connection between the wiring 82 of the wiring board 80 and the light emitting elements 40 can be made by any method. For example, the electric connection between the conductive members 70 and the wiring 82 of the wiring board 80 can be made by melting the conductive member arranged in the via holes, using pressure and heat.

The wiring board 80 may have a layered structure. For example, the wiring board 80 may be a metal plate with an insulative layer provided on the surface thereof. The wiring board 80 may be a TFT substrate having a plurality of TFTs (Thin-Film Transistors).

Light Source Member

The light source member includes the light emitting elements described above and the wavelength conversion member described above. It may further include a lightguide member that attaches the light emitting elements and the wavelength conversion member together. A light-transmitting resin material is used, for example, for the lightguide member. For example, the material of the lightguide member may be a light-transmitting thermosetting resin material such as an epoxy resin or a silicone resin, etc. The light source member may include an encapsulation member that covers the lateral surface of the light emitting elements directly or indirectly with a light-transmitting member such as the lightguide member therebetween. The encapsulation member is advantageously a light reflective member as is the cover member described above. The material, etc., thereof may also be similar to those of the cover member.

The light emitting module of the present disclosure can be used as a backlight of a liquid crystal display device, for example.

While certain embodiments of the present invention have been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A method of manufacturing a light emitting module comprising the steps of:
   providing a plurality of light emitting elements each including a semiconductor stack body and an electrode;
   providing a lightguide plate having a first surface and a second surface opposite to the first surface, wherein the second surface includes a plurality of recesses;
   arranging a light-transmitting member in each of the recesses, the light-transmitting member having an upper surface at a higher position than an upper end of the recess;
   adjusting upper surfaces of the light-transmitting members to a uniform height;
   placing a wavelength conversion member on the light-transmitting member;
   placing at least one of the plurality of light emitting elements on the wavelength conversion member with the electrode facing up;
   arranging a cover member that covers the plurality of light emitting elements;
   removing a part of the cover member until the electrode is exposed; and
   forming a wiring that electrically connects the plurality of light emitting elements together.

2. A method of manufacturing a light emitting module comprising the steps of:
   providing a plurality of light source members each including a light emitting element, which includes a semiconductor stack body and an electrode, and a wavelength conversion member;
   providing a lightguide plate having a first surface and a second surface opposite to the first surface, wherein the second surface includes a plurality of recesses;
   arranging a light-transmitting member in each of the recesses, the light-transmitting member having an upper surface at a higher position than an upper end of the recess;
   adjusting upper surfaces of the light-transmitting members to a uniform height;
   placing at least one of the plurality of light source members on the light-transmitting member with the electrode facing up;
   arranging a cover member that covers the plurality of light source members;
   removing a part of the cover member until the electrode is exposed; and
   forming a wiring that electrically connects the plurality of light source members together.

3. The method of manufacturing a light emitting module according to claim 1, wherein adjusting upper surfaces of the light-transmitting members to a uniform height includes grinding the light-transmitting members.

4. The method of manufacturing a light emitting module according to claim 2, wherein adjusting upper surfaces of the light-transmitting members to a uniform height includes grinding the light-transmitting members.

5. The method of manufacturing a light emitting module according to claim 1, wherein adjusting upper surfaces of the light-transmitting members to a uniform height includes pressing the light-transmitting members.

6. The method of manufacturing a light emitting module according to claim 2, wherein adjusting upper surfaces of the light-transmitting members to a uniform height includes pressing the light-transmitting members.

7. The method of manufacturing a light emitting module according to claim 1, wherein arranging a light-transmitting member includes continuously arranging a light-transmitting member in the recess and onto the second surface of the lightguide plate.

8. The method of manufacturing a light emitting module according to claim 2, wherein arranging a light-transmitting member includes continuously arranging a light-transmitting member in the recess and onto the second surface of the lightguide plate.

9. The method of manufacturing a light emitting module according to claim 3, wherein arranging a light-transmitting member includes continuously arranging a light-transmitting member in the recess and onto the second surface of the lightguide plate.

10. The method of manufacturing a light emitting module according to claim 4, wherein arranging a light-transmitting member includes continuously arranging a light-transmitting member in the recess and onto the second surface of the lightguide plate.

11. The method of manufacturing a light emitting module according to claim 5, wherein arranging a light-transmitting member includes continuously arranging a light-transmitting member in the recess and onto the second surface of the lightguide plate.

12. The method of manufacturing a light emitting module according to claim 6, wherein arranging a light-transmitting member includes continuously arranging a light-transmitting member in the recess and onto the second surface of the lightguide plate.

* * * * *